(12) United States Patent
Wen et al.

(10) Patent No.: US 10,798,842 B1
(45) Date of Patent: Oct. 6, 2020

(54) POWER MODULE

(71) Applicant: DELTA ELECTRONICS, INC., Taoyuan (TW)

(72) Inventors: Ping-Hung Wen, Taoyuan (TW); Ying-Ping Chen, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/732,340

(22) Filed: Jan. 1, 2020

(30) Foreign Application Priority Data

Sep. 27, 2019 (CN) .......................... 2019 1 0925669

(51) Int. Cl.
*H05K 7/14* (2006.01)
*H02B 1/052* (2006.01)

(52) U.S. Cl.
CPC ......... *H05K 7/1432* (2013.01); *H02B 1/0523* (2013.01); *H05K 7/1405* (2013.01); *H05K 7/1409* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,563,697 | B1 * | 5/2003 | Simbeck | H02B 1/052 200/295 |
| 7,667,146 | B2 * | 2/2010 | Eckardt | H02B 1/052 174/535 |
| 8,062,061 | B2 * | 11/2011 | Lim | H02B 1/052 439/532 |
| 9,276,333 | B1 * | 3/2016 | Wu | H01R 9/2608 |
| 9,331,404 | B2 * | 5/2016 | Devanand | H01R 9/2608 |
| 9,386,718 | B2 * | 7/2016 | Kusumi | H05K 7/14 |
| 9,801,302 | B2 * | 10/2017 | Huang | H05K 7/186 |
| 2008/0146055 | A1 | 6/2008 | Eckardt | |
| 2013/0216304 | A1 * | 8/2013 | Schumacher | H01R 13/633 403/376 |
| 2017/0238433 | A1 * | 8/2017 | Jiang | H05K 5/0221 174/535 |
| 2019/0148870 | A1 * | 5/2019 | Steinberger | H01R 25/162 49/449 |
| 2019/0157981 | A1 * | 5/2019 | Steinberger | H05K 7/1432 |

FOREIGN PATENT DOCUMENTS

EP 0740499 A1 10/1996

OTHER PUBLICATIONS

The pertinent parts of US2008/0146055A1.

* cited by examiner

*Primary Examiner* — Lisa Lea-Edmonds
(74) *Attorney, Agent, or Firm* — CKC & Partners Co., LLC

(57) ABSTRACT

A power module includes a housing, a support bracket, a sliding member and a resilient recovery member. The housing has a first surface and a second surface. The support bracket is fixed to the first surface. The support bracket has a hook to retain a first side of a support rail. The sliding member is slidably connected to the support bracket. The sliding member has a latch member to retain a second side of the support rail. The resilient recovery member has a first end connected to the support bracket and a second end connected to the sliding member. The resilient recovery member is to push the sliding member to cause the hook member and the latch member to sandwich the support rail. The sliding member has a first unlocking end for applying a force against the resilient recovery member. The first unlocking end projects beyond the second surface.

17 Claims, 8 Drawing Sheets

US 10,798,842 B1

POWER MODULE

CROSS-REFERENCE TO RELATED APPLICATION

This application claims priority to China Application Serial Number 201910925669.4, filed Sep. 27, 2019 which is herein incorporated by reference in its entirety.

BACKGROUND

Field of Disclosure

The present disclosure relates to a power module, and more particularly to a power module with a retaining mechanism.

Description of Related Art

Each electronic device requires a power module to convert a commercial power (e.g., alternating current) into a power supply form (e.g., direct current) required for the electronic device. When a large number of electronic devices are densely arranged in a certain area, a plurality of required external power supply modules need to be properly secured and arranged, so that the connected cables can be conveniently arranged, and the power module can be thermally-dissipated properly.

SUMMARY

The present disclosure provides a power module to deal with the needs of the prior art problems.

In one or more embodiments, a power module includes a housing, a support bracket, a sliding member and a resilient recovery member. The housing has a first surface, a second surface and a third surface. The second and third surfaces are perpendicularly connected to two opposite edges of the first surface respectively. The support bracket is fixed to the first surface, and the support bracket has a hook to retain a first side of a support rail. The sliding member is slidably connected to the support bracket, and the sliding member has a latch member to retain a second side of the support rail. The resilient recovery member has a first end connected to the support bracket and a second end connected to the sliding member, the resilient recovery member is configured to push the sliding member to cause the hook member and the latch member to sandwich the support rail. The sliding member has a first unlocking end and a second unlocking end for applying a force against the resilient recovery member, wherein the first unlocking end projects beyond the second surface, and the second unlocking end beyond the third surface.

In one or more embodiments, a power module includes a housing, a support bracket, a sliding member and a resilient recovery member. The housing has a first surface and a second surface. The support bracket is fixed to the first surface, and the support bracket has a hook to retain a first side of a support rail. The sliding member is slidably connected to the support bracket, and the sliding member has a latch member to retain a second side of the support rail. The resilient recovery member has a first end connected to the support bracket and a second end connected to the sliding member, the resilient recovery member is configured to push the sliding member to cause the hook member and the latch member to sandwich the support rail. The sliding member has a first unlocking end for applying a force against the resilient recovery member, wherein the first unlocking end projects beyond the second surface.

In one or more embodiments, the first unlocking end has a force-applying through hole.

In one or more embodiments, the second unlocking end has a force-applying board in parallel with the third surface.

In one or more embodiments, the first unlocking end has a force-applying board in parallel with the second surface.

In one or more embodiments, the power module further includes a lever structure disposed on the second surface, the lever structure is configured to drive the first unlocking end against the resilient recovery member.

In one or more embodiments, the lever structure comprises a force-applying rod that has a mid-section rotatably connected to a pivot on the second surface, and an end of the force-applying rod connected to the first unlocking end.

In one or more embodiments, the power module further includes a protrusion member projected from the second surface.

In one or more embodiments, the protrusion member is a bent section of the housing on the second surface.

In one or more embodiments, the protrusion member is an extension portion of the support bracket adjacent to the second surface.

In sum, the power module disclosed herein has a retaining mechanism for fastening to the support rail, so that a plurality of power modules can be arranged in a row. The locking member of the retaining mechanism, i.e., the sliding member, has an unlocking end that is easy for manually applying a force. Therefore, it is convenient for the user to install or detach the power module to facilitate the cable management, and the power modules in a row can also obtain proper heat dissipation.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
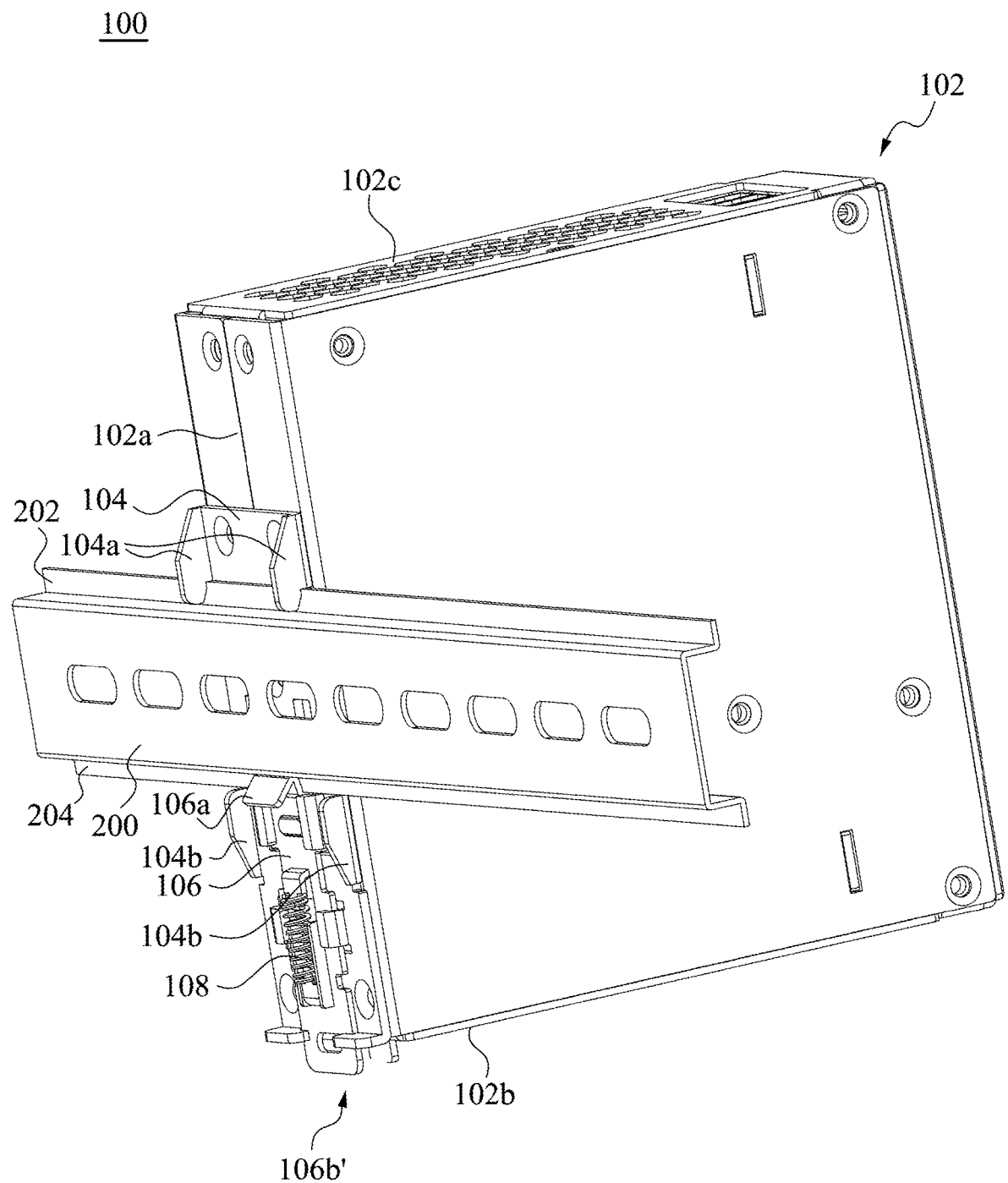
FIG. 1 illustrates a power module secured to a support rail according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Referring to FIG. 1, which illustrates a power module secured to a support rail according to one embodiment of the present disclosure. A power module 100 includes a housing 102, a support bracket 104 and a sliding member 106 and a resilient recovery member 108. The housing 102 has a first surface 102a, a second surface 102b and a third surface 102c, and the second surface 102b and the third surface 102c are perpendicularly connected to two opposite edges of the first surface 102a respectively. The support bracket 104 is fixed to the first surface 102a. In this embodiment, the support bracket 104 has a pair of hook members 104a configured to retain a first side 202 of the support rail 200. In other embodiments, the support bracket 104 may have a single hook member instead of a pair of hook member. Another support member 104b contacts the second side 204 of the support rail 200, the second side 204 and the first side 202 are two opposite sides of the support rail 200. The sliding member 106 is slidably connected to the support bracket 104. The sliding member 106 has a latch member 106a configured to retain the second side 204 of the support rail 200. The resilient recovery member 108 has a first end connected to the support bracket 104 and a second end connected to the sliding member 106. The resilient recovery member 108 is configured to push the sliding member 106 such that the hook member 104a and the latch member 106a can sandwich and secure the support rail 200, and the power module 100 can be fastened to the support rail 200. The support rail 200 also has a plurality of holes via which the support rail 200 can be attached to a wall or other body surface. The sliding member 106 has a first unlocking end 106b' for applying a force against the resilient recovery member 108, wherein the first unlocking end 106b' projects beyond the second surface 102b.

Figure 2:
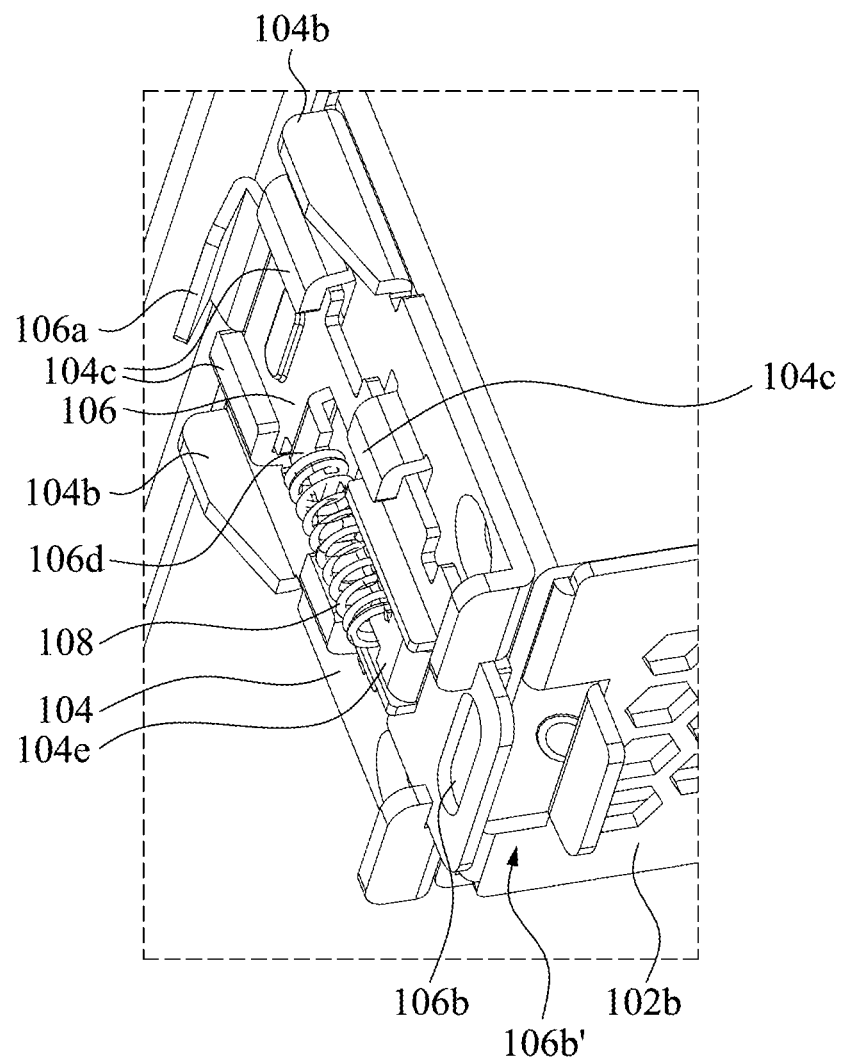
FIG. 2 illustrates an enlarged view of a sliding member of the power module in FIG. 1.

Referring to FIG. 2, which illustrates an enlarged view of a sliding member 106 of the power module in FIG. 1. The resilient recovery member 108 has a first end connected to a position member 104e of the support bracket 104 and a second end connected to a position member 106d of the sliding member 106. In this embodiment, the resilient recovery member 108 is a compression spring, but not being limited thereto. The first unlocking end 106b' has a force-applying through hole 106b allowing a fixture to be inserted and apply a force against the resilient recovery member 108 such that the latch member 106a is moved away from the support rail 200 to unlock or release the power module. Pairs of position members 104c on the support bracket 104 are configured to restrict the sliding member 106 to be slid along a predetermined route.

Figure 3:
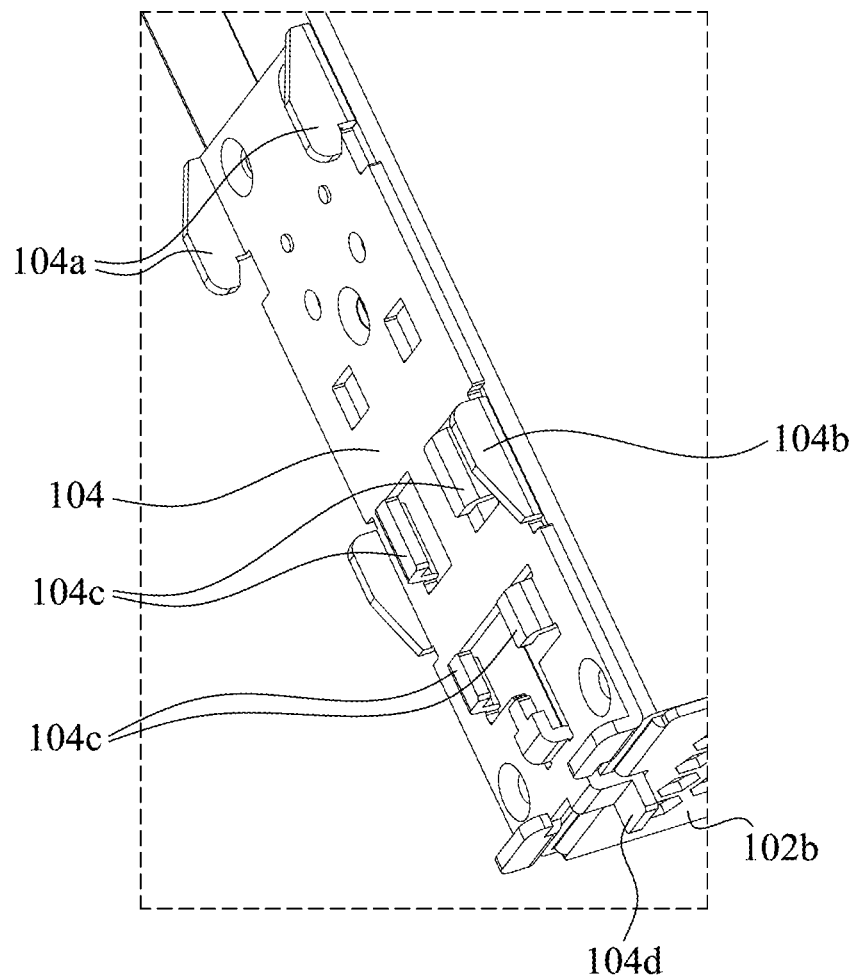
FIG. 3 illustrates an enlarged view of a support bracket of the power module in FIG. 1.

Referring to FIG. 3, which illustrates an enlarged view of a support bracket 104 of the power module in FIG. 1 (with sliding member 106 removed). The support bracket 104 has an end 104d adjacent to the second surface 102b and extended or projected beyond the second surface 102b to form a protrusion member.

Figure 4:
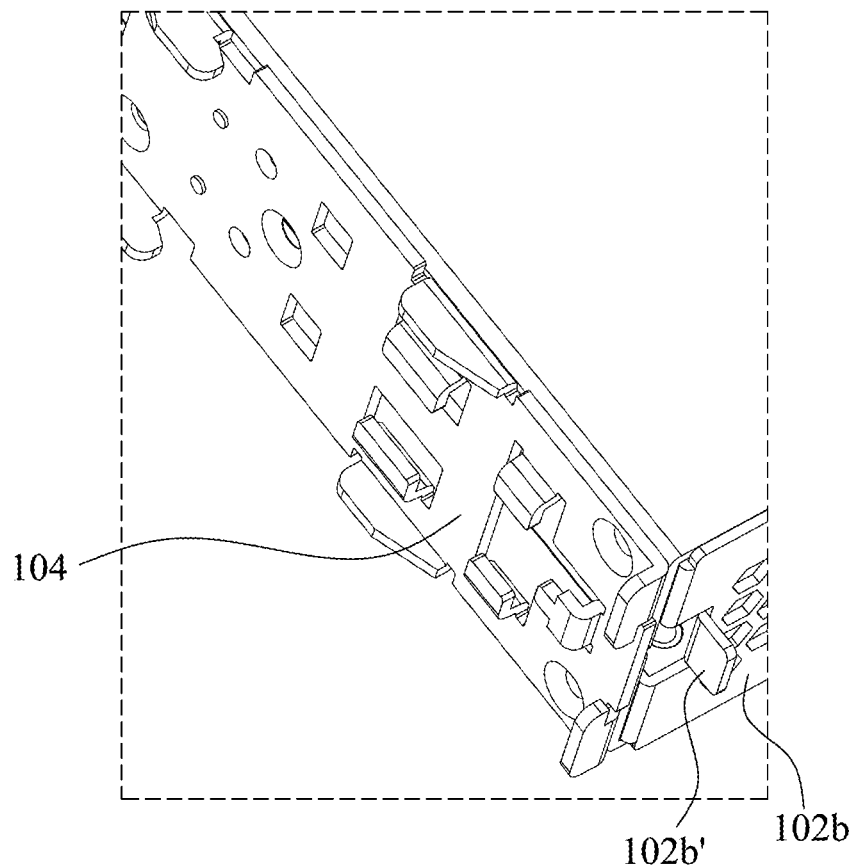
FIG. 4 illustrates an enlarged view of a support bracket of a power module according to another embodiment of the present disclosure.

Referring to FIG. 4, which illustrates an enlarged view of a support bracket 104 of a power module according to another embodiment of the present disclosure. In this embodiment, the support bracket 104 is not equipped with the end 104d adjacent to the second surface 102b and projected beyond the second surface 102b (referring to FIG. 3), and the protrusion member 102b' is a bent section of the housing 102 on the second surface 102b.

Figure 5:
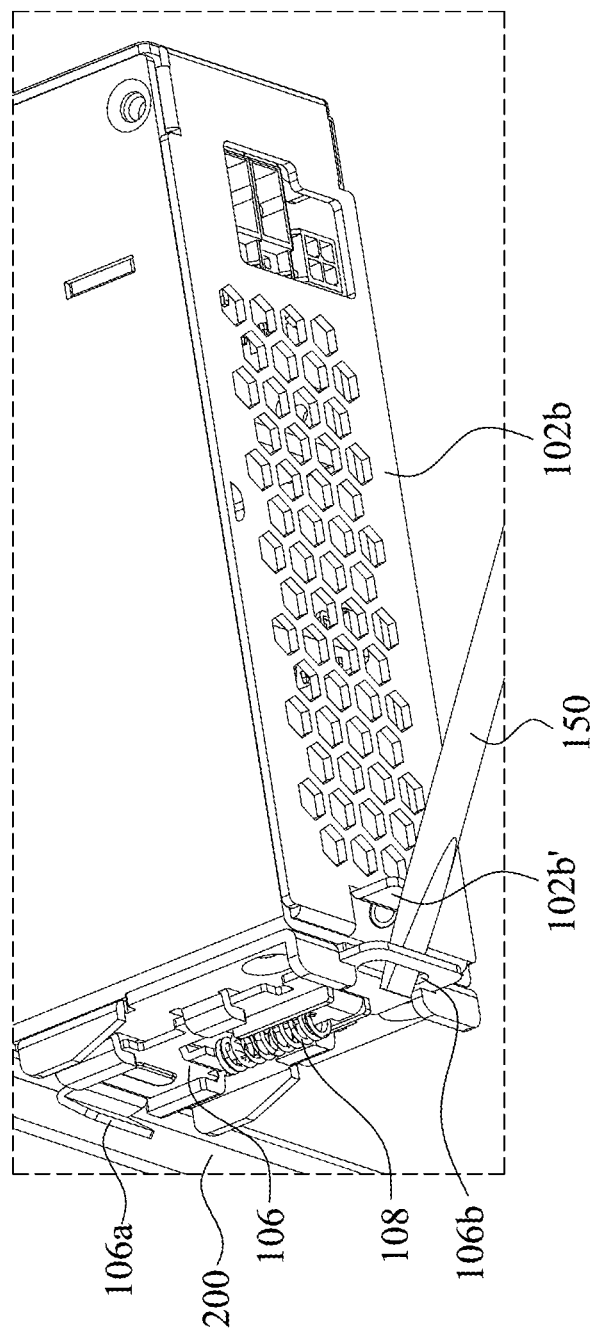
FIG. 5 illustrates how to use a fixture to unlock a power module from a support rail according to another embodiment of the present disclosure.

Referring to FIG. 5, which illustrates how to use a fixture 105 to unlock a power module from a support rail according to another embodiment of the present disclosure. The protrusion member 102b' projected from the second surface 102b serves as a pivot for a fixture 150, e.g., a screwdriver. When an end of the fixture 150 is utilized to engage a force-applying through hole 106b of the first unlocking end and the protrusion member 102b' is utilized as a pivot to apply a force to against the resilient recovery member 108, the required force is smaller than the force required to unlock the power module by the fixture 150 without the protrusion member 102b' as the pivot.

Figure 6:
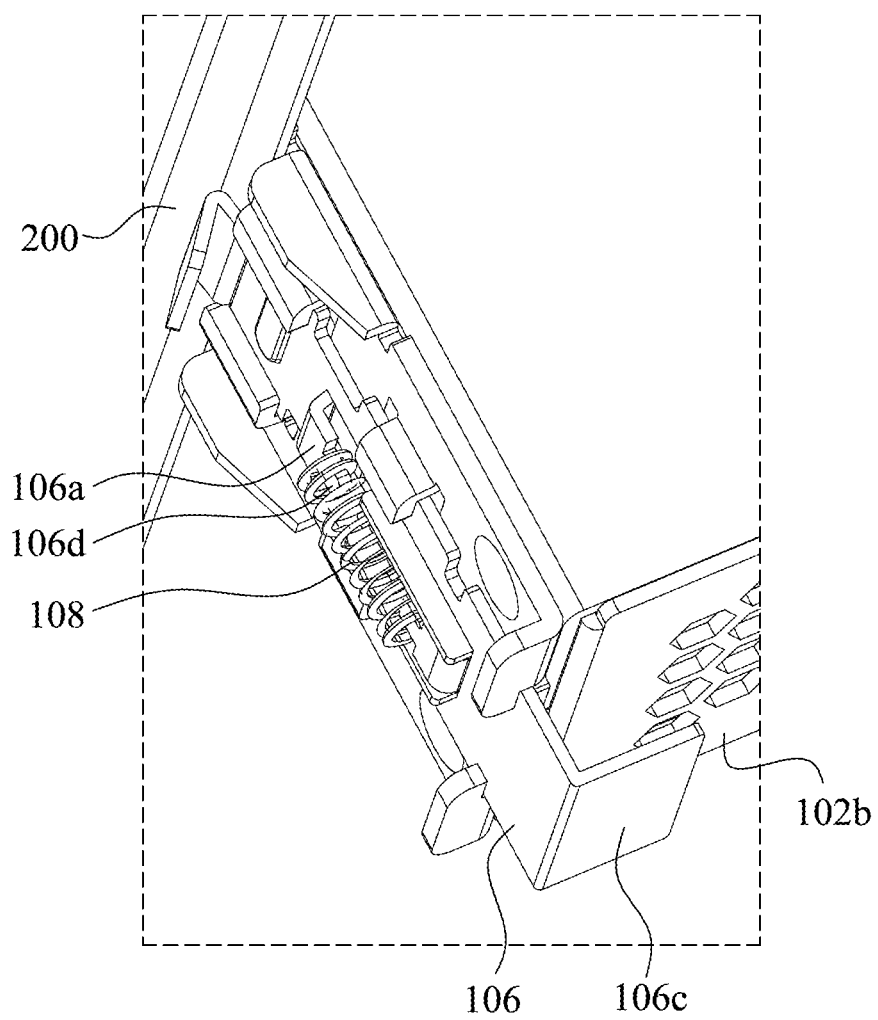
FIG. 6 illustrates an enlarged view of a sliding member of the power module according to still another embodiment of the present disclosure.

Referring to FIG. 6, which illustrates an enlarged view of a sliding member 106 of the power module according to still another embodiment of the present disclosure. In this embodiment, the first unlocking end of the sliding member 106 is equipped with a force-applying board 106c instead of the force-applying through hole. The fixture 150 may also be utilized to drive the force-applying board 106c against the resilient recovery member 108. In this embodiment, the force-applying board 106c is substantially parallel to the second surface 102b, but not being limited thereto.

Figure 7:
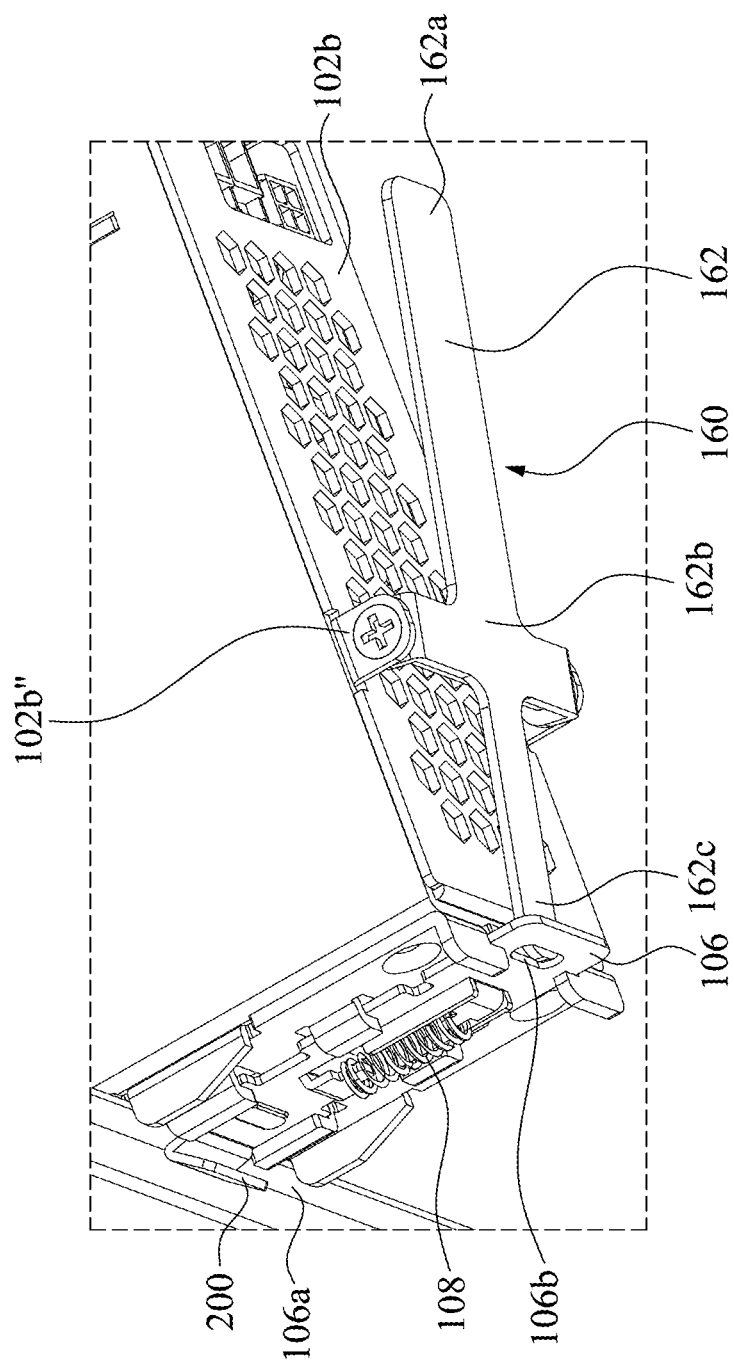
FIG. 7 illustrates an enlarged view of a lever structure of the power module according to still another embodiment of the present disclosure.

Referring to FIG. 7, which illustrates an enlarged view of a lever structure of the power module according to still another embodiment of the present disclosure. In addition to using the aforementioned fixture, a lever structure 160 may be installed on the second surface 102b to apply force to an unlocking end. The lever structure 160 has a force-applying rod 162 with a mid-section 162b pivoted to the pivot 102b" protruding from the second surface 102b. One end 162c of the force-applying rods 162 is used to engage the force-applying through hole 106b of the first unlocking end. When a force is applied to the other end 162a of the force-applying rod 162, the sliding member 106 can be driven against the resilient recovery member 108, thereby unlocking the power module from the support rail 200. When the pivot 102b is positioned closer to the end 162c (relative to the other end 162a), the force to unlock the power module will be smaller, i.e., the unlocking force required to apply to the end 162a will be smaller.

Figure 8:
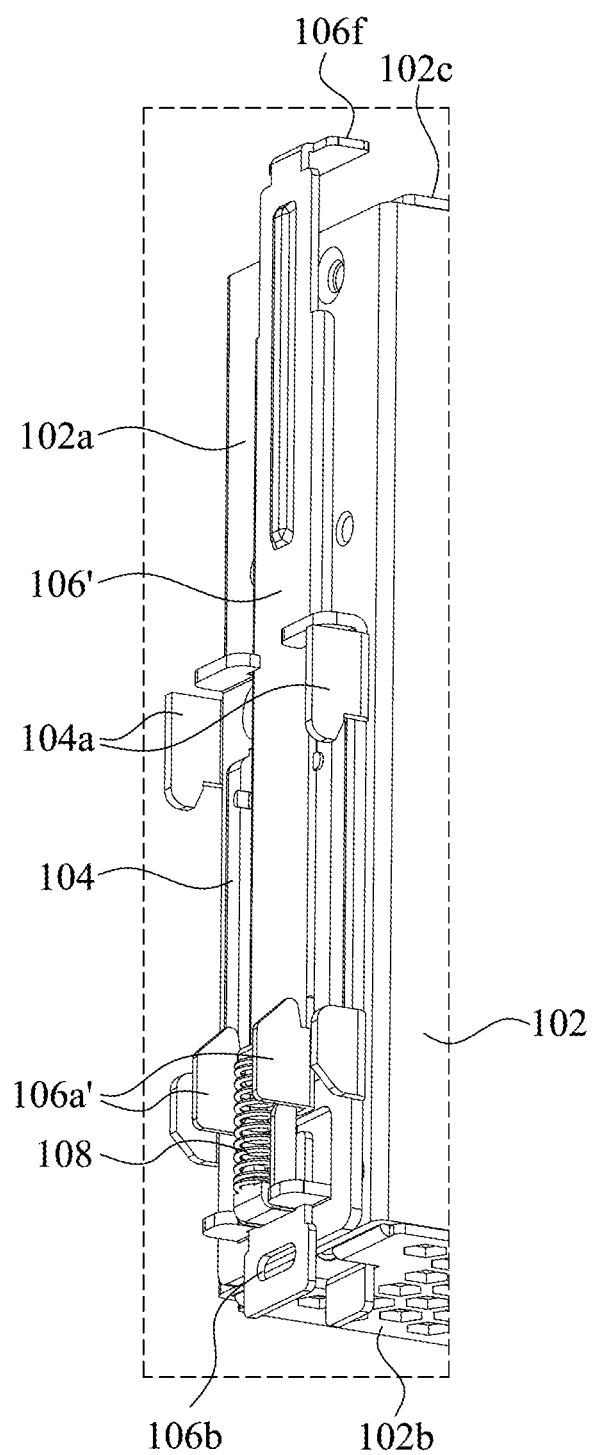
FIG. 8 illustrates a perspective view of a power module according to still another embodiment of the present disclosure.

Referring to FIG. 8, which illustrates a perspective view of a power module according to still another embodiment of the present disclosure. Different from the previous embodiments, the sliding member 106' further has a second unlocking end projected beyond the third surface 102c in addition to the first unlocking end. In this embodiment, the second unlocking end has a force-applying board 106f that is substantially parallel to the third surface 102c, but not being limited thereto. The first unlocking end and the second unlocking end of the sliding member 106' can both be utilized for applying a force against the resilient recovery member 108 so as to move the latch member 106a' away from the support rail 200.

In sum, the power module disclosed herein has a retaining mechanism for fastening to the support rail, so that a plurality of power modules can be arranged in a row. The locking member of the retaining mechanism, i.e., the sliding member, has an unlocking end that is easy for manually applying a force. Therefore, it is convenient for the user to install or detach the power module to facilitate the cable management, and the power modules in a row can also obtain proper heat dissipation.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A power module comprising:
    a housing having a first surface, a second surface and a third surface, the second and third surfaces are perpendicularly connected to two opposite edges of the first surface respectively;
    a support bracket fixed to the first surface and having a hook member to retain a first side of a support rail;
    a sliding member slidably connected to the support bracket, the sliding member has a latch member to retain a second side of the support rail, wherein the first side and the second side are two opposite sides of the support rail; and
    a resilient recovery member has a first end connected to the support bracket and a second end connected to the sliding member, the resilient recovery member is configured to push the sliding member to cause the hook member and the latch member to sandwich the support rail,
    wherein the sliding member has a first unlocking end and a second unlocking end for applying a force against the resilient recovery member, the first unlocking end projects beyond the second surface, the second unlocking end projects beyond the third surface.

2. The power module of claim 1, wherein the first unlocking end has a force-applying through hole.

3. The power module of claim 1, wherein the second unlocking end has a force-applying board in parallel with the third surface.

4. The power module of claim 1, wherein the first unlocking end has a force-applying board in parallel with the second surface.

5. The power module of claim 1, further comprising a lever structure disposed on the second surface, the lever structure is configured to drive the first unlocking end against the resilient recovery member.

6. The power module of claim 5, wherein the lever structure comprises a force-applying rod that has a mid-section rotatably connected to a pivot on the second surface, and an end of the force-applying rod connected to the first unlocking end.

7. The power module of claim 1, further comprising a protrusion member projected from the second surface.

8. The power module of claim 7, wherein the protrusion member is a bent section of the housing on the second surface.

9. The power module of claim 7, wherein the protrusion member is an extension portion of the support bracket adjacent to the second surface.

10. A power module comprising:
    a housing having a first surface and a second surface, the second surface is perpendicularly connected to an edge of the first surface respectively;
    a support bracket fixed to the first surface and having a hook member to retain a first side of a support rail;
    a sliding member slidably connected to the support bracket, the sliding member has a latch member to retain a second side of the support rail, wherein the first side and the second side are two opposite sides of the support rail; and
    a resilient recovery member has a first end connected to the support bracket and a second end connected to the sliding member, the resilient recovery member is configured to push the sliding member to cause the hook member and the latch member to sandwich the support rail,
    wherein the sliding member has a first unlocking end for applying a force against the resilient recovery member, the first unlocking end projects beyond the second surface.

11. The power module of claim 10, wherein the first unlocking end has a force-applying through hole.

12. The power module of claim 10, wherein the first unlocking end has a force-applying board in parallel with the second surface.

13. The power module of claim 10, further comprising a lever structure disposed on the second surface, the lever structure is configured to drive the first unlocking end against the resilient recovery member.

14. The power module of claim 13, wherein the lever structure comprises a force-applying rod that has a mid-section rotatably connected to a pivot on the second surface, and an end of the force-applying rod connected to the first unlocking end.

15. The power module of claim 10, further comprising a protrusion member projected from the second surface.

16. The power module of claim 15, wherein the protrusion member is a bent section of the housing on the second surface.

17. The power module of claim 15, wherein the protrusion member is an extension portion of the support bracket adjacent to the second surface.

* * * * *